US007486533B2

(12) United States Patent
Mawatari

(10) Patent No.: US 7,486,533 B2
(45) Date of Patent: Feb. 3, 2009

(54) NONVOLATILE SEMICONDUCTOR MEMORY

(75) Inventor: Hiroshi Mawatari, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/889,775

(22) Filed: Aug. 16, 2007

(65) Prior Publication Data
US 2007/0296017 A1    Dec. 27, 2007

Related U.S. Application Data

(63) Continuation of application No. PCT/JP2005/002550, filed on Feb. 18, 2005.

(51) Int. Cl.
*G11C 5/06*    (2006.01)
(52) U.S. Cl. ............... 365/63; 365/185.05; 365/185.26; 365/185.27
(58) Field of Classification Search .................. 365/63, 365/185.05, 185.26, 185.27
See application file for complete search history.

(56) References Cited

U.S. PATENT DOCUMENTS 5,406,514 A    4/1995    Yoneda

| 5,787,035 A | 7/1998 | Kang et al. |
| 6,614,684 B1 * | 9/2003 | Shukuri et al. ......... 365/185.05 |
| 7,020,018 B2 * | 3/2006 | Hsieh et al. ............ 365/185.03 |

FOREIGN PATENT DOCUMENTS

| JP | 05-174583 A | 7/1993 |
| JP | 10-093057 A | 4/1998 |

* cited by examiner

*Primary Examiner*—Pho M. Luu
(74) *Attorney, Agent, or Firm*—Arent Fox LLP

(57) ABSTRACT

A nonvolatile semiconductor memory in which the area of each memory cell is small and which can perform high-speed operation with accuracy. A pair of honeycomb-like diffusion layers which are deviated from each other by a quarter-pitch are formed. Memory transistors (MemoryTr) and select transistors (SelectTr) are formed at portions where a pair of adjacent word lines pass over one diffusion layer and at portions where another pair of adjacent word lines pass over the other diffusion layer. In this case, the memory transistors and the select transistors are arranged so as to form a memory cell between a pair of bit lines connected to each diffusion layer. As a result, though the select transistors are located, many memory cells can be arranged like an array in a small layout area.

9 Claims, 5 Drawing Sheets

NONVOLATILE SEMICONDUCTOR MEMORY

This application is a continuing application, filed under 35 U.S.C. §111(a), of International Application PCT/JP2005/002550, filed on Feb. 18, 2005.

BACKGROUND OF THE INVENTION (1) Field of the Invention

This invention relates to a nonvolatile semiconductor memory and, more particularly, to a nonvolatile semiconductor memory, such as a flash memory, to which data can be written and in which data can be erased.

(2) Description of the Related Art

Flash memories are nonvolatile semiconductor memories in which written data can instantly be erased in the block, and are widely used at present as data stores in various apparatus, such as computers and portable terminals. A flash memory has an array structure in which many memory cells are connected by bit lines and word lines. Usually a NOR type, a NAND type, and the like are known as methods for connecting memory cells. Data is written to a memory cell selected by a bit line and a word line. Written data is read out or erased from a memory cell selected by a bit line and a word line.

A memory cell may have a structure including, for example, a stacked gate memory transistor fabricated by forming a floating gate over a semiconductor substrate in which a diffusion layer to be used as a source region and a drain region is formed with a gate insulating film between and by forming a control gate over the floating gate with an insulating film between. With such a memory cell, data is stored with an electric charge held in the floating gate located nearer the semiconductor substrate. That is to say, when voltage is applied to the control gate, the threshold of the memory cell is low if an electric charge is not held in the floating gate. The threshold of the memory cell is high if an electric charge is injected into and held in the floating gate. Accordingly, the difference in threshold between these two states is used for storing data.

A channel hot electron injection, for example, is known as a method for injecting an electric charge into the floating gate. With the channel hot electron injection, hot electrons accelerated in a channel region between the source region and the drain region by a horizontal electric field are injected into the floating gate by a gate electric field. An FN tunnel emission, for example, is known as a method for emitting an electric charge held in the floating gate. With the FN tunnel emission, by applying a positive voltage to the semiconductor substrate or applying a negative voltage to the control gate, a Fowler-Nordheim (FN) tunnel current is made to flow and an electric charge is drawn out from the floating gate.

As stated above, such flash memories are currently used in various apparatus. Not only increasing data storage capacity but also miniaturizing memory devices themselves have become important problems. For example, devising the arrangement of an array with a rise in the integration level of memory cells as a primary object is proposed to solve these problems (see Japanese Patent Laid-Open Publication No. Hei10-93057). Up to that time the method of connecting a drain region common to two memory transistors to a bit line via a contact portion had been adopted for arranging an array. According to this proposal, four memory, transistors share one source region or one drain region when an array is arranged. By doing so, an attempt to reduce the area of contact portions and to raise the integration level of memory cells is made.

With conventional general flash memories of, for example, the NOR type, structurally random access can be gained and reading is performed at a high speed. However, over-erasing and the like may occur. Accordingly, sufficient care must be devoted to the lowering of the threshold of a memory transistor. However, if the threshold is not lowered sufficiently to avoid over-erasing, then the difference in threshold between a state in which data is written to the memory transistor and a state in which data stored in the memory transistor is erased becomes small. This leads to a data write/erase error or makes high-speed reading difficult. With conventional general flash memories of the NAND type, structurally the threshold of a memory transistor can be lowered to a value obtained at the time of a floating gate being in a depletion state. However, a source region or a drain region is common to a plurality of memory transistors, so it is very difficult to read out data at a high speed.

A flash memory using not only memory transistors but also select transistors has recently been reported. FIG. 5 shows an example of a layout of a conventional flash memory using a select transistor.

FIG. 5 shows a memory cell 100 including a laminated structure which consists of a floating gate (FG) 101 and a control gate (CG) 102 and a select gate (SG) 103 adjacent to the laminated structure. The memory cells 100 are separated by a shallow trench isolation (STI) 104.

In each memory cell 100 the floating gate (FG) 101 is formed over a semiconductor substrate with an insulating film between. The control gate 102 is formed straight over the floating gates 101 formed in the memory cells 100 with an insulating film between. The select gate 103 is formed over the semiconductor substrate with an insulating film between in parallel with the control gate 102. A source line (SL) 105 and a drain region 106 are formed in the semiconductor substrate. A source contact portion 107 is connected to the source line 105 which extends parallel with the control gate 102 and the like. A bit contact portion 109 which connects with a bit line (BL) 108 at an upper layer that extends in a direction perpendicular to the control gate 102 and the like is connected to the drain region 106.

With a NOR-type flash memory not using a select transistor, the following problem arises. When written data is erased, an electric current also flows through a non-selected memory transistor if the threshold of a selected memory transistor becomes a negative voltage. This leads to a data write/erase error. By using the above select transistor, a sufficiently great difference in electric current can be secured between a state in which data is written to a memory transistor and a state in which data is erased in the memory transistor even if the threshold of the memory transistor becomes a negative voltage. As a result, data can be written/erased with accuracy and high-speed reading can be performed. However, if a select transistor is simply formed in a NOR-type flash memory, the area of each memory cell increases accordingly.

SUMMARY OF THE INVENTION

The present invention was made under the background circumstances described above. An object of the present invention is to provide a nonvolatile semiconductor memory which includes select transistors and in which the area of each memory cell is small.

In order to achieve the above object, there is provided a nonvolatile semiconductor memory comprising a plurality of diffusion layers formed in a semiconductor substrate and each having the shape of a honeycomb from above and memory transistors and select transistors each having a source region and a drain region in one of the plurality of diffusion layers.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
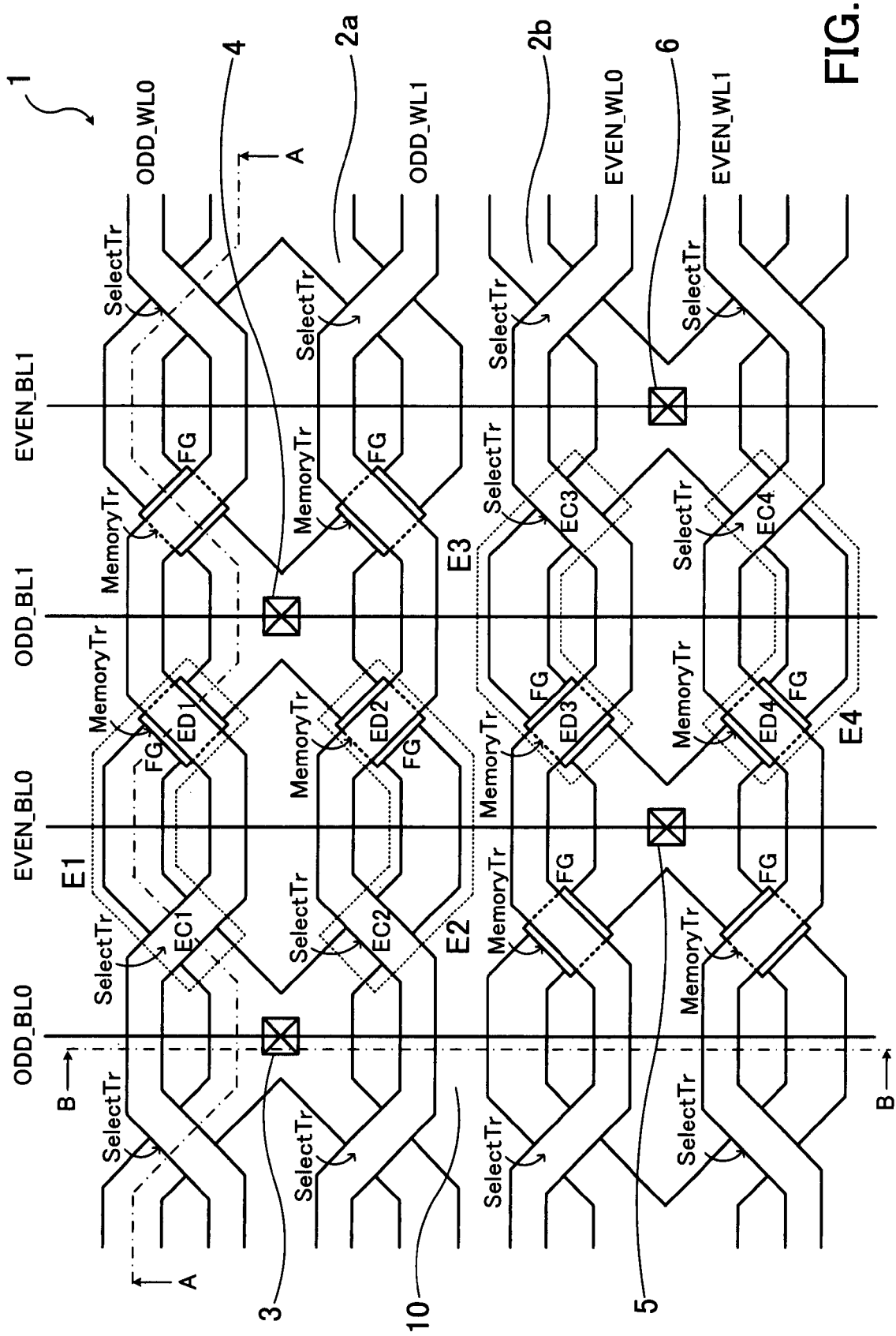
FIG. 1 is a partially schematic view showing a layout of a flash memory.

Embodiments of the present invention will now be described in detail with a flash memory as an example by referring to the drawings.

With an ordinary memory cell arrangement, memory cells are arranged like an array at positions where bit lines and word lines intersect. In addition to the ordinary memory cell arrangement, there are memory cell arrangements in which a bit line pitch or a word line pitch is changed with a reduction in area as a primary object. For example, a bit line pitch or a word line pitch is set to half of the bit line pitch or the word line pitch of the ordinary memory cell arrangement and memory cells are arranged (half-pitch type memory cell arrangement). Furthermore, a bit line pitch and a word line pitch are set to half of the bit line pitch of the ordinary memory cell arrangement and half of the word line pitch of the ordinary memory cell arrangement and memory cells are arranged (quarter-pitch type memory cell arrangement). With the half-pitch type memory cell arrangement and the quarter-pitch type memory cell arrangement, the integration level of memory cells can be raised by reducing the area of each memory cell. However, the quarter-pitch type memory cell arrangement is more effective from the viewpoint of the efficiency of a reduction of the area of a memory cell. The quarter-pitch type memory cell arrangement is adopted in the following flash memory.

Figure 2:
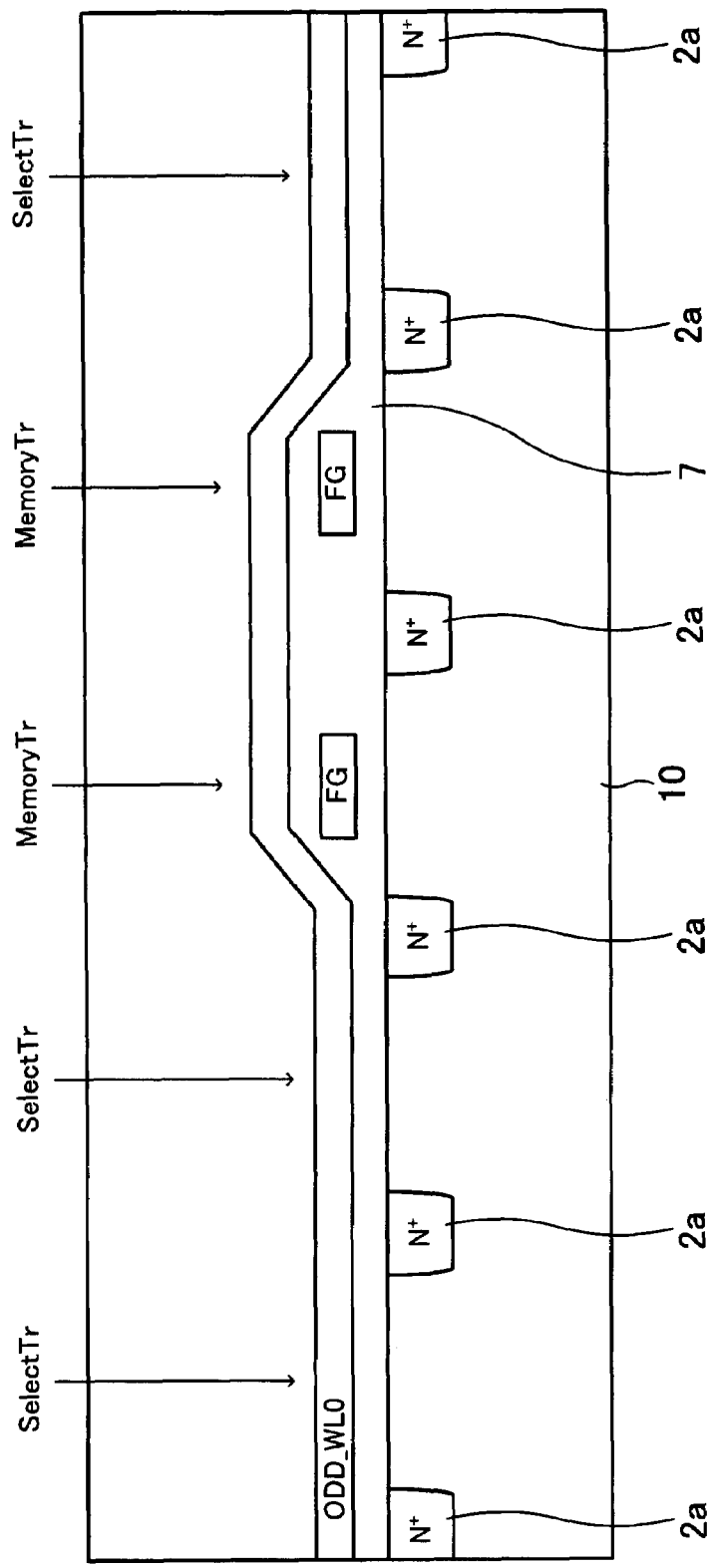
FIG. 2 is a schematic sectional view taken along the line A-A of FIG. 1.
Figure 3:
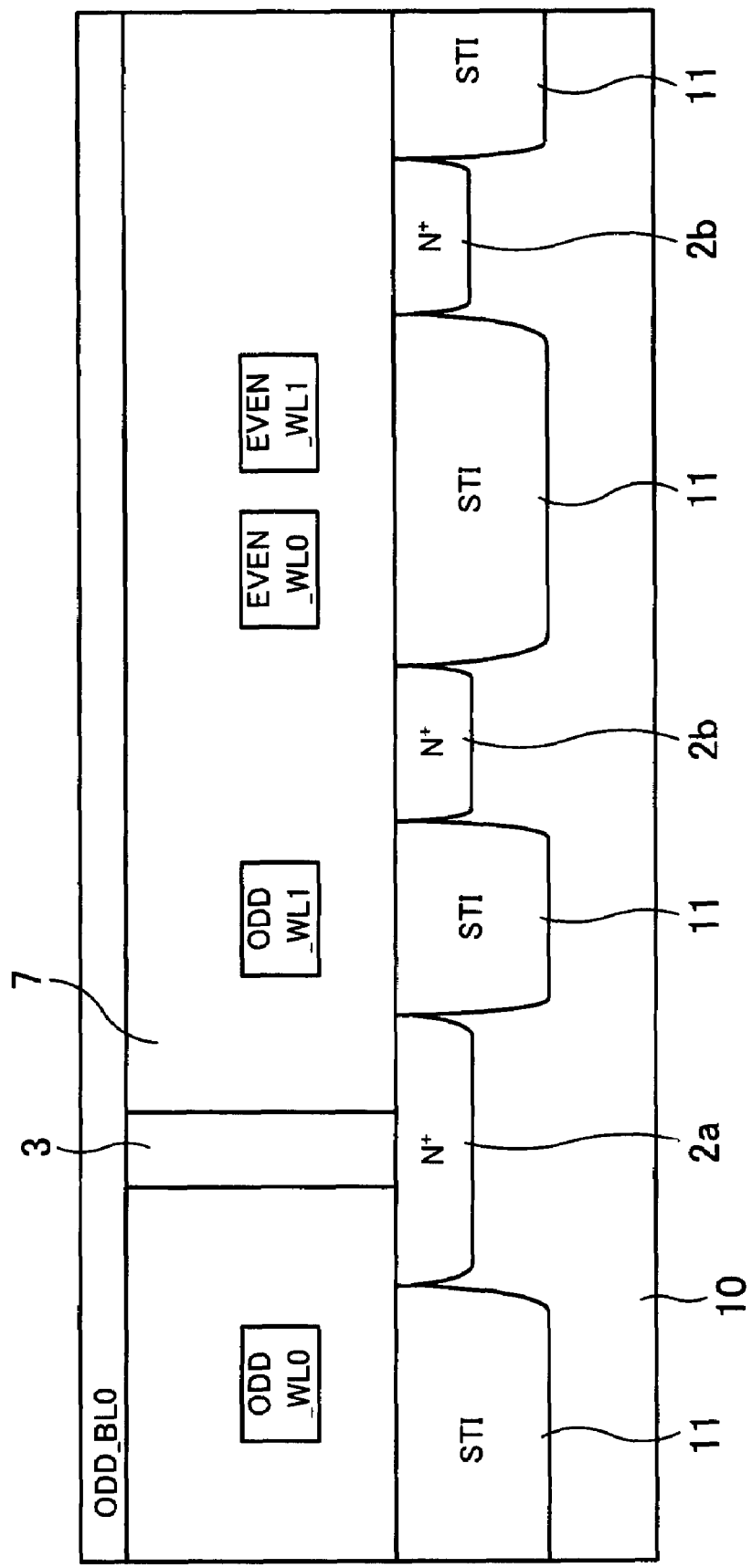
FIG. 3 is a schematic sectional view taken along the line B-B of FIG. 1.
Figure 4:
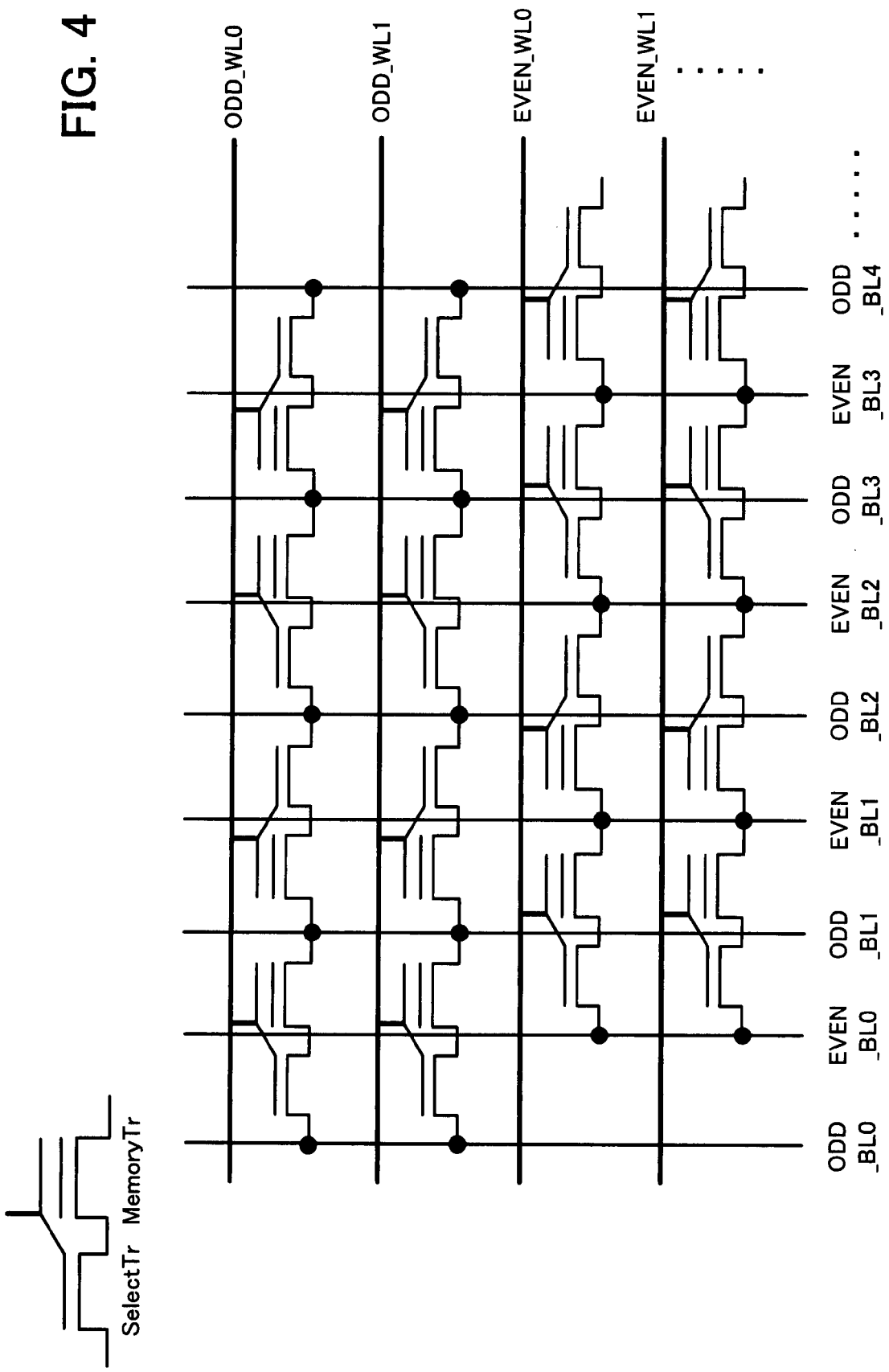
FIG. 4 is a circuit diagram showing an equivalent circuit of the flash memory.
Figure 5:
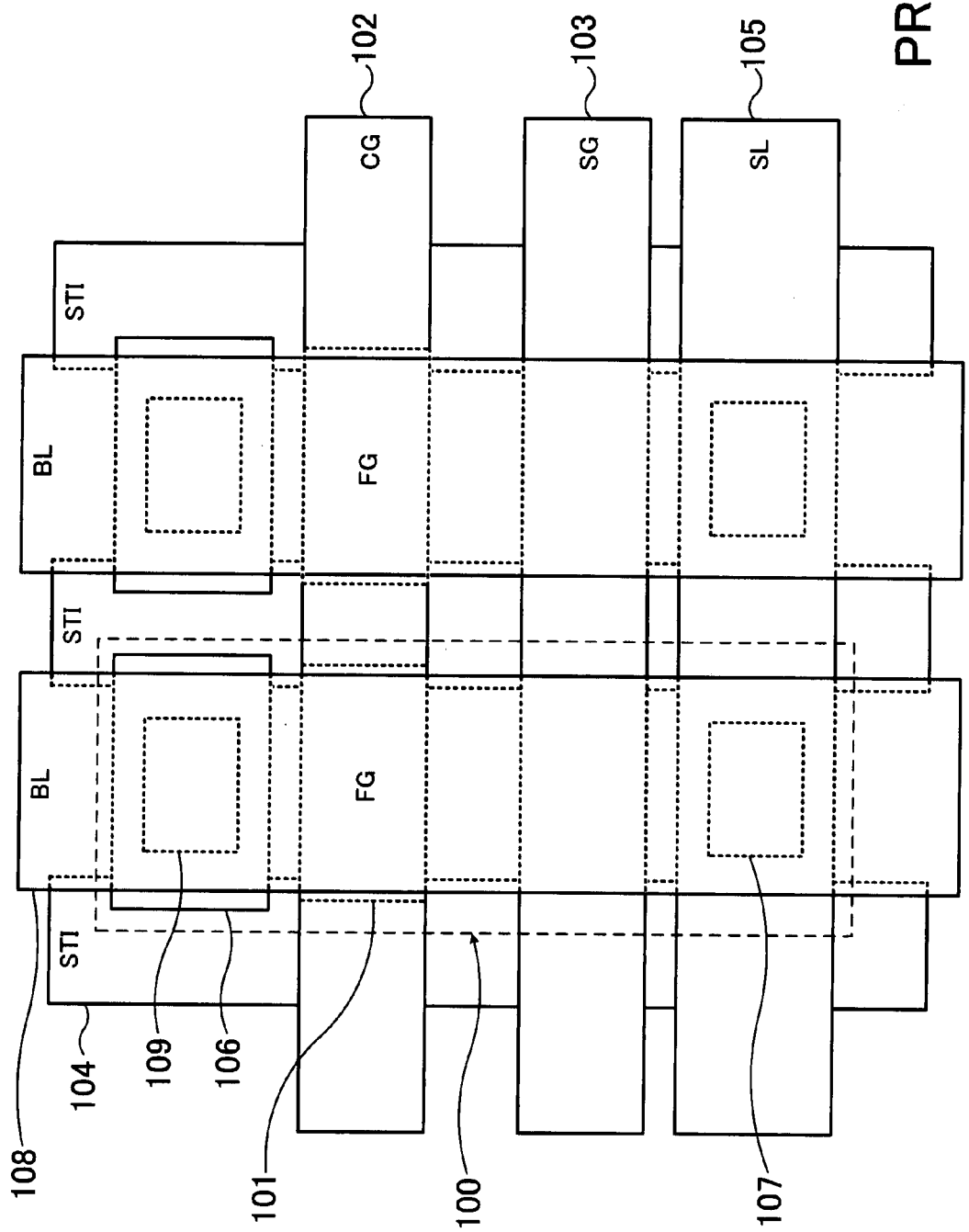
FIG. 5 shows an example of a layout of a conventional flash memory using a select transistor.

FIG. 1 is a partially schematic view showing a layout of a flash memory. FIG. 2 is a schematic sectional view taken along the line A-A of FIG. 1. FIG. 3 is a schematic sectional view taken along the line B-B of FIG. 1. FIG. 4 is a circuit diagram showing an equivalent circuit of the flash memory.

In a flash memory 1 shown in FIGS. 1 through 3, diffusion layers 2a and 2b to be used as a source region or a drain region of a transistor included in a memory cell are formed in a semiconductor substrate 10 like a honeycomb and are separated by STIs 11. The adjacent diffusion layers 2a and 2b are deviated from each other by a quarter-pitch. Each of the honeycomb-like diffusion layers 2a and 2b branches off once in two directions and the two branches combine again at a region (combination region). Contact portions 3 and 4 which connect with bit lines ODD_BL0 and ODD_BL1 respectively are connected to combination regions of the diffusion layer 2a. Contact portions 5 and 6 which connect with bit lines EVEN_BL0 and EVEN_BL1 respectively are connected to combination regions of the diffusion layer 2b. The diffusion layers 2a and 2b are deviated from each other by a quarter-pitch, so the contact portions 3 and 4 connected to the diffusion layer 2a and the contact portions 5 and 6 connected to the diffusion layer 2b are alternately arranged in the horizontal direction in FIG. 1.

The contact portion 4 is connected to one of the two combination regions of the diffusion layer 2a shown in FIG. 1. Four floating gates FG are formed above the diffusion layer 2a so as to enclose this combination region. A pair of word lines ODD_WL0 and ODD_WL1 is located for the diffusion layer 2a. As shown in FIGS. 1 and 2, each word line is formed over two of the four floating gates FG. As a result, a total of four stacked gate memory transistors (MemoryTr) are formed around the contact portion 4 which connects with the bit line ODD_BL1. The word line ODD_WL0 or ODD_WL1 is formed over a floating gate FG in each stacked gate memory transistor. In addition, four select transistors (SelectTr) are formed in regions where the word lines ODD_WL0 and ODD_WL1 pass over the diffusion layer 2a around the contact portion 3 which connects with the bit line ODD_BL0. The word lines ODD_WL0 and ODD_WL1 which are formed so as to pass over the diffusion layer 2a in the regions function as control gates of the memory transistors over the floating gates FG formed around the contact portion 4 and function as select gates of the select transistors in the regions around the contact portion 3 where the word lines ODD_WL0 and ODD_WL1 pass over the diffusion layer 2a. One memory cell includes a pair of a memory transistor and a select transistor adjacent to each other between the contact portions 3 and 4.

Similarly, four memory transistors are formed around the contact portion 5 which connects with the bit line EVEN_BL0. A word line EVEN_WL0 or EVEN_WL1 is formed over a floating gate FG in each memory transistor. In addition, four select transistors are formed around the contact portion 6 which connects with the bit line EVEN_BL1. One memory cell includes a pair of a memory transistor and a select transistor adjacent to each other between the contact portions 5 and 6.

As shown in FIGS. 2 and 3, appropriate insulating films 7 (each of which may include two or more kinds of insulating films) are formed between the semiconductor substrate 10 and the floating gates FG, between the semiconductor substrate 10 and the word lines, and between the floating gates FG and the word lines. In FIGS. 1 through 3, only part of the flash memory 1 is shown. However, it is a matter of course that this structure is really formed extensively in the flash memory 1 to obtain a necessary number of memory cells (see FIG. 4).

The first notable point of the flash memory 1 having the above structure is that the honeycomb-like diffusion layers 2a and 2b are formed and that the adjacent diffusion layers 2a and 2b are deviated from each other by a quarter-pitch. The second notable point of the flash memory 1 is that a source region and a drain region in a memory cell are not specified. Usually a source region and a drain region are independent of each other in each memory cell of a NOR-type flash memory. In a NAND-type flash memory, on the other hand, common diffusion layers are formed and a common source region and a common drain region are included. A virtual ground method is adopted in the above flash memory 1.

With the flash memory 1, as stated above, the honeycomb-like diffusion layers 2a and 2b to be used as a source region or a drain region are formed and the virtual ground method is adopted. Accordingly, even if the select transistors are used, it is possible to arrange many memory cells like an array in a small layout area at a high integration level without exercising a bad influence on operation accuracy or operation speed.

The operations of reading out data from the flash memory 1 having the above structure, writing data to the flash memory 1, and erasing data in the flash memory 1 will now be described concretely with reference to FIGS. 1 through 4. For convenience sake, as shown in FIG. 1, the two select transistors formed between the contact portions 3 and 4 by using the diffusion layer 2a are called EC1 and EC2 and the two memory transistors formed between the contact portions 3 and 4 by using the diffusion layer 2a are called ED1 and ED2. The memory cell including the select transistor EC1 and the memory transistor ED1 is called E1 and the memory cell including the select transistor EC2 and the memory transistor ED2 is called E2. Similarly, as shown in FIG. 1, the two select transistors formed between the contact portions 5 and 6 by using the diffusion layer 2b are called EC3 and EC4 and the two memory transistors formed between the contact portions 5 and 6 by using the diffusion layer 2b are called ED3 and ED4. The memory cell including the select transistor EC3 and the memory transistor ED3 is called E3 and the memory cell including the select transistor EC4 and the memory transistor ED4 is called E4. The operations of reading out data from each of the memory cells E1, E2, E3, and E4, writing data to each of the memory cells E1, E2, E3, and E4, and erasing data in each of the memory cells E1, E2, E3, and E4 will now be described.

First, the operation of reading out data will be described.

To read out data from the memory cell E1, a voltage of, for example, 5V is applied to the word line ODD_WL0 which functions as the select gate of the select transistor EC 1 and the control gate of the memory transistor ED1. In addition, a voltage of 1V is applied to the bit line ODD_BL0 connected to the contact portion 3 connected to the combination region on the select transistor EC 1 side of the diffusion layer 2a and a voltage of 0V is applied to the bit line ODD_BL1 connected to the contact portion 4 connected to the combination region on the memory transistor ED1 side of the diffusion layer 2a. At this time whether the memory transistor ED1 is in the on state or the off state depends on whether an electric charge exists in the floating gate FG of the memory cell E1. Accordingly, data can be read out by determining whether an electric current flows between the bit lines ODD_BL0 and ODD_BL1.

Similarly, to read out data from the memory cell E2, a voltage of, for example, 5V is applied to the word line. ODD_WL1, a voltage of, for example, 1V is applied to the bit line ODD_BL0, and a voltage of, for example, 0V is applied to the bit line ODD_BL1.

The virtual ground method is used. Therefore, to read out data from the memory cell E1 or E2 in this way, a voltage of 1V must also be applied to a bit line BL located on a side opposite to the bit line ODD_BL1 of the bit line ODD_BL0 to which a voltage of 1V is applied.

To read out data from the memory cell E3, a voltage of, for example, 5V is applied to the word line EVEN_WL0, a voltage of, for example, 0V is applied to the bit line EVEN_BL0, and a voltage of, for example, 1V is applied to the bit line EVEN_BL1.

Similarly, to read out data from the memory cell E4, a voltage of, for example, 5V is applied to the word line EVEN_WL1, a voltage of, for example, 0V is applied to the bit line EVEN_BL0, and a voltage of, for example, 1V is applied to the bit line EVEN_BL1.

To read out data from the memory cell E3 or E4 in this way, a voltage of 1V must also be applied to a bit line BL located on a side opposite to the bit line EVEN_BL0 of the bit line EVEN_BL1 to which a voltage of 1V is applied. This is the same with the memory cells E1 and E2.

With the above flash memory 1, high-speed reading can be performed with accuracy by alternately performing the operation of reading out data from the memory cell E1 or E2 having the source region and the drain region in the diffusion layer 2a and the operation of reading out data from the memory cell E3 or E4 having the source region and the drain region in the diffusion layer 2b.

Secondly, the operation of writing data will be described.

To write data to the memory cell E1, a voltage of, for example, 10V is applied to the word line ODD_WL0, a voltage of, for example, 0V is applied to the bit line ODD_BL0, and a voltage of, for example, 5V is applied to the bit line ODD_BL1. By doing so, the select transistor EC1 goes into the on state. In addition, voltage is applied to the insulating film between the floating gate FG and a channel region of the memory transistor ED1. As a result, the channel hot electron injection phenomenon by which electrons are injected into the floating gate FG occurs and writing is performed.

Similarly, to write data to the memory cell E2, a voltage of, for example, 10V is applied to the word line ODD_WL1, a voltage of, for example, 0V is applied to the bit line ODD_BL0, and a voltage of, for example, 5V is applied to the bit line ODD_BL1.

To write data to the memory cell E1 or E2 in this way, a voltage of 5V must also be applied to a bit line BL located on a side opposite to the bit line ODD_BL0 of the bit line ODD-EBL1 to which a voltage of 5V is applied.

To write data to the memory cell E3, a voltage of, for example, 10V is applied to the word line EVEN_WL0, a voltage of, for example, 5V is applied to the bit line EVEN_BL0, and a voltage of, for example, 0V is applied to the bit line EVEN_BL1.

Similarly, to write data to the memory cell E4, a voltage of, for example, 10V is applied to the word line EVEN_WL1, a voltage of, for example, 5V is applied to the bit line EVEN_BL0, and a voltage of, for example, 0V is applied to the bit line EVEN_BL1.

To write data to the memory cell E3 or E4 in this way, a voltage of 5V must also be applied to a bit line BL located on a side opposite to the bit line EVEN_BL1 of the bit line EVEN_BL0 to which a voltage of 5V is applied. This is the same with the memory cells E1 and E2.

With the above flash memory 1, high-speed writing can be performed with accuracy by alternately performing the operation of writing data to the memory cell E1 or E2 having the source region and the drain region in the diffusion layer 2a and the operation of writing data to the memory cell E3 or E4 having the source region and the drain region in the diffusion layer 2b.

Finally, the operation of erasing data will be described.

One method for erasing data in the memory cells. E1, E2, E3, and E4 is to apply a voltage of 10V to all of the bit lines ODD_BL0, ODD_BL1, EVEN_BL0, and EVEN_BL1 connected to the diffusion layer 2a or 2b and to apply a voltage of −10V to all of the word lines ODD_WL0, ODD_WL1, EVEN_WL0, and EVEN_WL1. By doing so, an FN tunnel electric current flows and electrons which have been injected into a floating gate FG of each of the memory transistors ED1, ED2, ED3, and ED4 are drawn out. As a result, the data is erased.

Instead of applying a voltage of 10V to all of the bit lines ODD_BL0, ODD_BL1, EVEN_BL0, and EVEN_BL1, a voltage of 10V may be applied to the semiconductor substrate 10. By doing so, an electric potential difference arises between the word lines ODD_WL0, ODD_WL1, EVEN_WL0, and EVEN_WL1 to which a voltage of −10V is applied and the semiconductor substrate 10 and electrons are drawn out to the semiconductor substrate 10. As a result, the data is erased. However, to erase the data with accuracy, a triple well structure must be formed in the semiconductor substrate 10.

As has been described in the foregoing, the bit lines ODD_BL0 and ODD_BL1 are used for the memory cell E1 or E2 using the word line ODD_WL0 or ODD_WL1 as a gate when data is read out from or written to the flash memory 1 having the above structure. The bit lines EVEN_BL0 and EVEN_BL1 are used for the memory cell E3 or E4 using the word line EVEN_WL0 or EVEN_WL1 as a gate when data is read out from or written to the flash memory 1. When reading or writing is performed in this way, high-speed operation can be performed with accuracy by alternately making the memory cell E1 or E2 and the memory cell E3 or E4 operate.

With conventional NOR-type flash memories not having a select gate structure, an electric current flows through a non-selected memory cell if the threshold of a memory cell becomes a negative voltage at the time of erasing. This has a bad influence on the characteristics of a memory cell from which data is read out. With the flash memory 1 having the above structure, however, the select transistors EC1, EC2, EC3, and EC4 are included in the memory cells E1, E2, E3, and E4 respectively. Therefore, even if the threshold of the memory transistor ED1, ED2, ED3, or ED4 becomes a negative voltage at the time of erasing data, the selected memory cell E1, E2, E3, or E4 is not influenced. As a result, even if the data is erased, the threshold can be made approximately zero. If the threshold becomes approximately zero, there is a sufficiently great difference in electric current between a state in which data is written and a state in which data is erased. Accordingly, data can be read out at a high speed with accuracy.

The above descriptions are given by taking a flash memory as an example of a nonvolatile semiconductor memory. However, the present invention is applicable to an electrically erasable programmable read only memory (EEPROM) and the like in addition to a flash memory.

With the nonvolatile semiconductor memory according to the present invention, the honeycomb-like diffusion layers are formed and the memory transistors and the select transistors each having a source region and a drain region in one of the diffusion layers are formed. This makes it possible to fabricate a nonvolatile semiconductor memory in which select transistors are used and in which the area of each memory cell is small, while securing accurate high-speed operation. Therefore, data storage capacity can be increased and a device itself can be miniaturized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A nonvolatile semiconductor memory comprising
a plurality of diffusion layers formed in a semiconductor substrate and each having a shape of a honeycomb; and
memory transistors and select transistors each having a source region and a drain region in one of the plurality of diffusion layers.

2. The nonvolatile semiconductor memory according to claim 1, wherein one diffusion layer is deviated from a second diffusion layer adjacent to the one diffusion layer by a quarter-pitch.

3. The nonvolatile semiconductor memory according to claim 1, further comprising word lines which pass over plural portions of the plurality of diffusion layers, wherein one of the memory transistors and the select transistors using the word lines as gates are formed over each of the plural portions of the plurality of diffusion layers.

4. The nonvolatile semiconductor memory according to claim 3, wherein two word lines which do not cross are located for each of the plurality of diffusion layers.

5. The nonvolatile semiconductor memory according to claim 3, wherein at operation time voltage is applied to each of the word lines which pass over the plural portions of the plurality of diffusion layers.

6. The nonvolatile semiconductor memory according to claim 3, wherein:
each of the memory transistors includes a floating gate which is located between the semiconductor substrate and one of the word lines and which is covered with an insulating film; and
each of the select transistors includes an insulating film between the semiconductor substrate and one of the word lines.

7. The nonvolatile semiconductor memory according to claim 1, wherein:
a plurality of memory transistors share a combination region of one of the plurality of diffusion layers as source regions or drain regions;
a plurality of select transistors share a second combination region nearest the combination region as one of source regions and drain regions; and
a memory cell includes a combination of a memory transistor and a select transistor located between the combination region and the second combination region.

8. The nonvolatile semiconductor memory according to claim 7, wherein bit lines are connected to the combination region and the second combination region of each of the plurality of diffusion layers.

9. The nonvolatile semiconductor memory according to claim 1, wherein a memory transistor and a select transistor which have source regions and drain regions in one of the plurality of diffusion layers and a memory transistor and a select transistor which have source regions and drain regions in another of the plurality of diffusion layers are alternately made to operate.

* * * * *